US006859113B2

(12) United States Patent
Giousouf et al.

(10) Patent No.: US 6,859,113 B2
(45) Date of Patent: Feb. 22, 2005

(54) TEMPERATURE COMPENSATION MECHANISM FOR A MICROMECHANICAL RING RESONATOR

(75) Inventors: Metin Giousouf, Esslingen (DE); Heinz Kück, Stuttgart (DE); Rainer Platz, Neuchâtel (CH)

(73) Assignee: ETA SA Fabriques D'Ebauches, Grenchen (CH)

( * ) Notice: Subject to any disclaimer, the term of this patent is extended or adjusted under 35 U.S.C. 154(b) by 0 days.

(21) Appl. No.: 10/650,811

(22) Filed: Aug. 29, 2003

(65) Prior Publication Data

US 2004/0041643 A1 Mar. 4, 2004

Related U.S. Application Data

(62) Division of application No. 10/129,193, filed as application No. PCT/CH00/00583 on Nov. 1, 2000, now Pat. No. 6,686,807.

(30) Foreign Application Priority Data

Nov. 2, 1999 (DE) .......................................... 199 52 763

(51) Int. Cl.[7] ................................................ H03B 5/30
(52) U.S. Cl. ................ 331/154; 331/116 M; 73/504.04
(58) Field of Search ........................ 331/108 C, 108 D, 331/116 R, 116 M, 154; 73/504.17, 504.18, 504.2–504.8, 504.13; 361/283.1

(56) References Cited

U.S. PATENT DOCUMENTS

| 3,602,842 | A | * | 8/1971 | Smith ..................... 331/116 M |
| 5,025,346 | A | | 6/1991 | Tang et al. ............... 361/283.1 |
| 5,226,321 | A | | 7/1993 | Varnham et al. ......... 73/514.02 |
| 5,450,751 | A | | 9/1995 | Putty et al. .............. 73/504.18 |
| 5,547,093 | A | | 8/1996 | Sparks ........................ 438/52 |
| 5,616,864 | A | * | 4/1997 | Johnson et al. .......... 73/504.04 |
| 5,652,374 | A | | 7/1997 | Chia et al. .................... 73/1.38 |
| 5,856,765 | A | | 1/1999 | Hermann ................. 331/108 C |
| 6,218,915 | B1 | | 4/2001 | Schallner .................... 333/219 |

* cited by examiner

Primary Examiner—Minh Nguyen
(74) Attorney, Agent, or Firm—Sughrue Mion, PLLC

(57) ABSTRACT

A time base including a resonator (4) and an integrated electronic circuit (3) for driving the resonator into oscillation and for producing, in response to the oscillation, a signal having a determined frequency. The resonator is an integrated micromechanical ring resonator supported above a substrate (2) and adapted to oscillate in a first oscillation mode. The ring resonator includes a free-standing oscillating structure (6). Electrodes (100, 120; 130, 150) are positioned under the free-standing oscillating structure in such a way as to drive and sense a second oscillation mode in a plane substantially perpendicular to the substrate and having a resonant frequency which is different from the resonant frequency of the first oscillation mode, a frequency difference between the resonant frequencies of both oscillation modes being used for compensating for the effect of temperature on the frequency of the signal produced by the time base.

9 Claims, 9 Drawing Sheets

TEMPERATURE COMPENSATION MECHANISM FOR A MICROMECHANICAL RING RESONATOR

RELATED APPLICATION

This application is a division of U.S. patent application Ser. No. 10/129,193 (now U.S. Pat. No. 6,686,807) filed on May 2, 2002 in the name of Metin GIOUSOUF et al. and entitled "Time base comprising an integrated micromechanical ring resonator" which is assigned to the present Assignee, and which is incorporated herein by reference.

TECHNICAL FIELD

The present invention relates to a time base, i.e. a device comprising a resonator and an integrated electronic circuit for driving the resonator into oscillation and for producing, in response to this oscillation, a signal having a determined frequency as well as to a resonator for use in such a time base. The present invention more particularly relates to a compensation mechanism for compensating for the effect of temperature on the resonant frequency of the resonator.

BACKGROUND ART

Time bases, or frequency standards, are required in a large variety of electronic devices, ranging from wristwatches and other timepieces to complex telecommunication devices. Such time bases are typically formed by an oscillator including a quartz resonator and an electronic circuit for driving the resonator into oscillation. An additional division chain may be used to divide the frequency of the signal produced by the oscillator in order to obtain a lower frequency. Other parts of the circuit may serve to adjust the frequency, for example by adjusting the division ratio of the division chain. The components of the electronic circuit are advantageously integrated onto a single semiconductor substrate in CMOS technology. Other functions, not directly related to the frequency processing, may be integrated onto the same substrate.

Advantages of quartz resonators are their high quality factor Q leading to good frequency stability and low power consumption as well as their good temperature stability. A disadvantage of typical time bases using quartz resonators however resides in the fact that two components, namely the quartz resonator and the integrated electronic circuit, are required in order to provide a high-precision frequency. A discrete quartz resonator requires board space which is scarce in many cases. For instance, a standard quartz resonator for wristwatch applications requires space of the order of $2 \times 2 \times 6$ mm$^3$. Moreover, additional costs are caused by the assembly and connection of the two components. Yet, space and assembly costs are major issues, especially in the growing field of portable electronic devices.

A solution to the above-mentioned problems is to provide a time base comprising an integrated resonator.

More particularly, one solution consists in providing a time base comprising a resonator and an integrated circuit for driving the resonator into oscillation and for producing, in response to the oscillation, a signal having a determined frequency, the resonator being an integrated micromechanical ring resonator supported above a substrate and adapted to oscillate, according to a first oscillation mode, around an axis of rotation substantially perpendicular to the substrate, this ring resonator comprising:

a central post extending from the substrate along the axis of rotation;

a free-standing oscillating structure connected to the central post and including an outer ring coaxial with the axis of rotation and connected to the central post by means of a plurality of spring elements; and electrode structures disposed around the outer ring and connected to the integrated electronic circuit. Advantages on this solution reside in the fact that the time base may be fully integrated on a single substrate, is suitable for mass production and is compatible with CMOS technology. In addition, such a time base is low-priced and requires only a very small surface area on a semiconductor chip.

An advantage of this time base lies in the fact that the micromechanical ring resonator exhibits a high quality factor Q. Quality factors as high as $2 \times 10^5$ have been measured. For comparison, tuning-fork quartz resonators usually exhibit values between $5 \times 10^4$ and $1 \times 10^5$ after laser trimming of the fork tines. Different design features favouring a high quality factor Q are proposed.

In addition, for a given resonant frequency, the surface area required on the substrate to form the ring resonator is small in comparison with other resonators.

The electronic circuit may advantageously be integrated on the substrate together with the micromechanical ring resonator, thereby leading to a low-priced time base. A lower price is also obtained by wafer-level packaging of the resonator using wafer-bonding technology.

It must be pointed out that ring resonators having similar features are known from sensing devices, such as angular rate sensors, accelerometers or gyroscopes. For instance U.S. Pat. No. 5,450,751 to Putty et al. and U.S. Pat. No. 5,547,093 to Sparks both disclose a micromechanical ring resonator for a vibratory gyroscope comprising a plated metal ring and spring system supported above a silicon substrate. U.S. Pat. No. 5,872,313 to Zarabadi et al. discloses a variant of the above sensor which is configured to exhibit minimum sensitivity to temperature variation. U.S. Pat. No. 5,025,346 also discloses a ring resonator for use as a micro-sensor in a gyroscope or an angular rate sensor.

None of the above-cited documents however indicates or suggests using such a type of ring resonator in an oscillator circuit to act as a frequency standard or time base. Moreover, a number of design features (e.g. the shape and number of spring elements) of the ring resonators disclosed in these documents are such that they would not be suitable for horological applications where frequency stability and low power consumption are essential. For instance, the resonating structures disclosed in U.S. Pat. No. 5,025,346 exhibit a quality factor ranging from 20 to 140 which is too low for being used in a highly precise time base in horological applications, whereas quartz resonators used in horological applications exhibit quality factors of the order of $1 \times 10^4$ to $1 \times 10^5$.

Within the scope of the above solution, various design features are proposed which lead to a high quality factor Q, a high stability of the oscillation frequency against variations in the amplitude of the driving voltage, and tolerance of fabrication process variations. In fact, one of the major objectives for an application as an oscillator is a high quality factor Q. A high quality factor Q results in a stable oscillation with low phase noise and low power consumption, as is required for horological applications.

One problem of the above solution however resides in the effect of temperature on the resonant frequency of the resonator. The resonant frequency of the ring resonator is, within the temperature range of 0 to 60° C., in good approximation, a linear function of temperature. At a resonant frequency of 45 kHz, it has been observed that the thermal coefficient of the resonant frequency is of the order of −25 ppm/° C.

Two main factors determine the temperature characteristics of the ring resonator. Firstly, Young's modulus E of the material used to realize the vibrating structure decreases with increasing temperature resulting in a reduced stiffness of the spring elements and therefore a lower resonant frequency. Secondly, due to thermal expansion, the diameter of the ring will increase with increasing temperature resulting in an increased mass moment of inertia of the structure, which, in turn, also reduces the resonant frequency.

One solution to the above problem may consist in integrating a temperature measuring circuit on the substrate in order to compensate for the effect of temperature on the frequency of the signal produced by the time base. Such compensation of the resonator's temperature dependency may easily be effected since the above ring resonator has the advantage of exhibiting substantially linear temperature characteristics.

Another solution to the above problem may consist in forming a second micromechanical ring resonator on the substrate in order to allow temperature compensation.

SUMMARY OF THE INVENTION

An object of the present invention is to provide a mechanism for substantially compensating for the effect of temperature on the resonant frequency of the ring resonator which does not require an additional temperature measuring circuit or an additional resonator.

Accordingly, there is provided a time base of the above-mentioned type, as well as a method for driving the time base resonator into oscillation, wherein electrodes are positioned under the free-standing oscillating structure in such a way as to drive and sense a second oscillation mode in a plane substantially perpendicular to the substrate and having a resonant frequency which is different from the resonant frequency of the first oscillation mode, a frequency difference between the resonant frequencies of both oscillation modes being used for compensating for the effect of temperature on the frequency of the signal produced by the time base.

According to the present invention, temperature compensation is accordingly achieved by using a single micromechanical ring resonator which is operated simultaneously with two oscillation modes having different resonant frequencies.

Other aspects, features and advantages of the present invention will be apparent upon reading the following detailed description of non-limiting examples and embodiments made with reference to the accompanying drawings, in which:

EMBODIMENTS OF THE INVENTION

Figure 1:
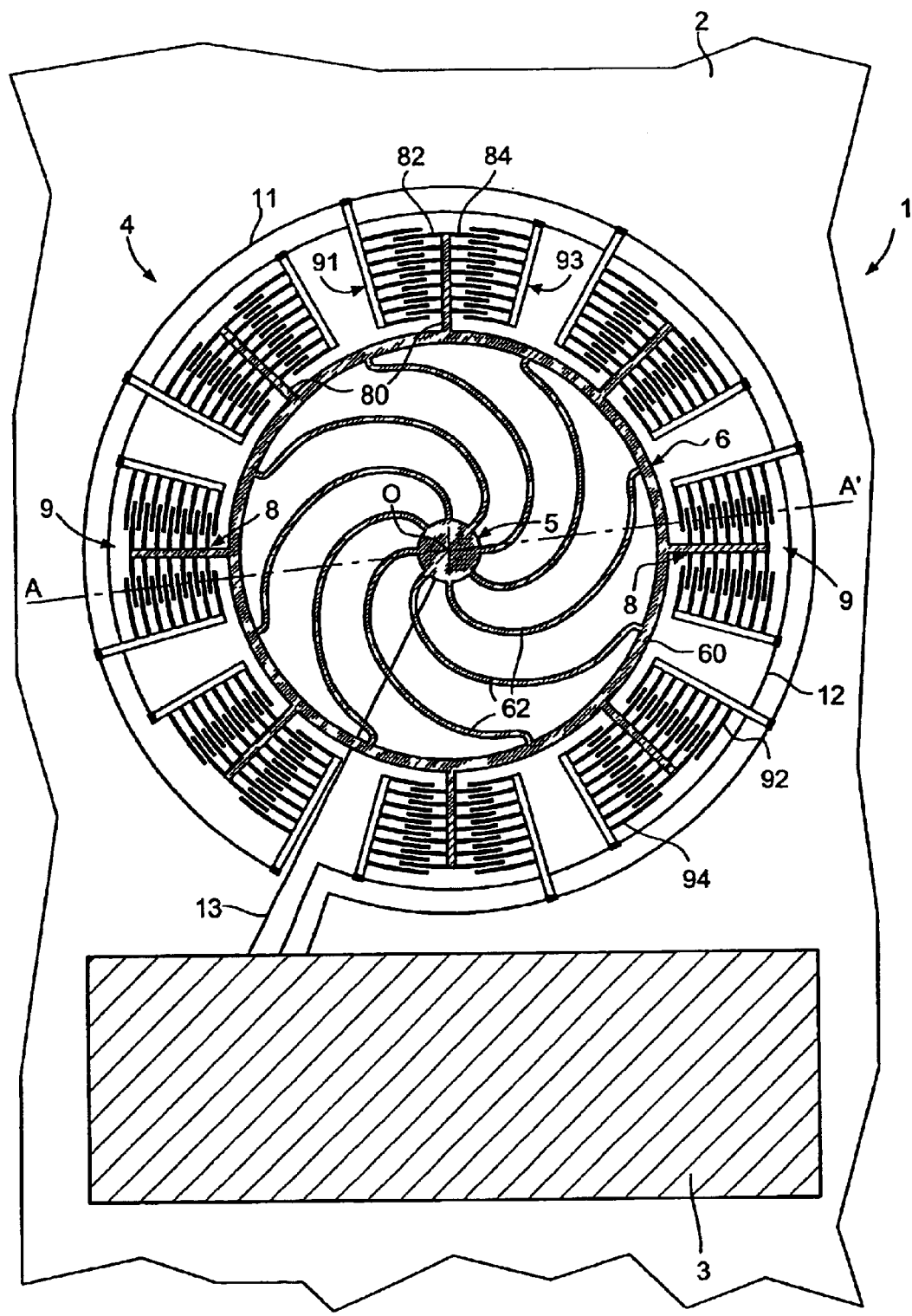
FIG. 1 is a top view illustrating schematically a first embodiment of a time base comprising a micromechanical ring resonator and an integrated electronic circuit.
Figure 4:
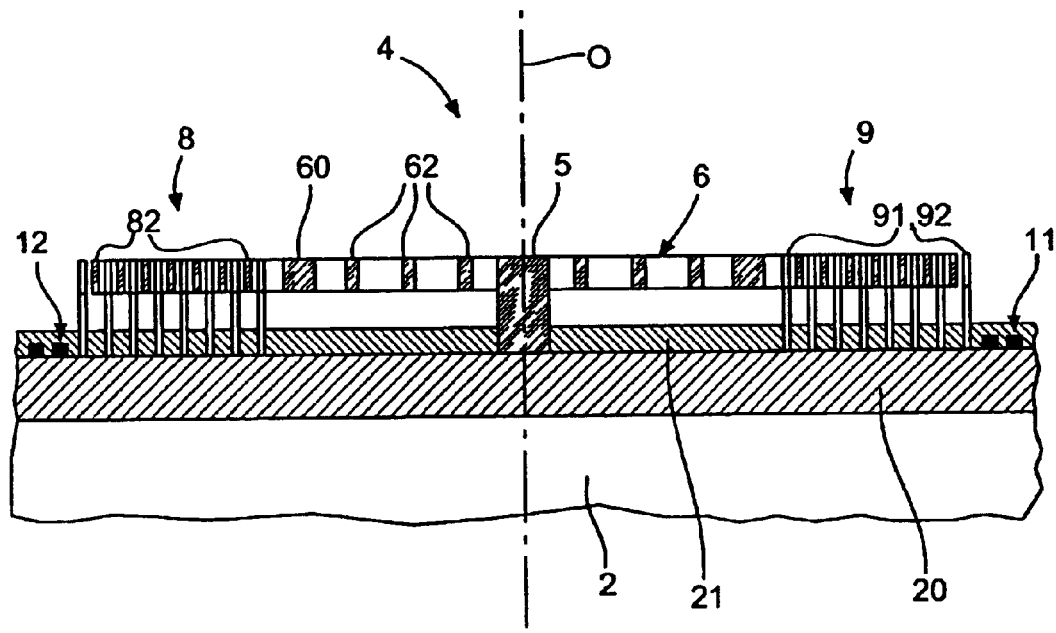
FIG. 4 is a cross-sectional view of the micromechanical ring resonator of FIG. 1 taken along line A–A'.

FIG. 1 schematically shows a top view of a first embodiment of a time base. There is shown an integrated time base, indicated generally by reference numeral 1, comprising a resonator 4 and an integrated electronic circuit 3 for driving the resonator into oscillation and for producing, in response to this oscillation, a signal having a determined frequency. FIG. 4 shows a cross-sectional view of the ring resonator 4 taken along line A–A' as shown in FIG. 1.

The integrated electronic circuit 3 is not shown in detail since this circuit may easily be designed by those skilled in the art. Preferably both the integrated electronic circuit 3 and the resonator 4 are realized and integrated on a same substrate 2 as illustrated in FIG. 1. A preferred substrate material is silicon, but other similar materials known by those skilled in the art to be equally suitable for realising the time base of the present invention may be used.

The resonator 4 is realised in the form of a monolithic micromechanical resonating ring, hereinafter referred to as a micromechanical ring resonator, which is essentially supported above the substrate 2 and adapted to oscillate around an axis of rotation O substantially perpendicular to the substrate 2. The ring resonator 4 essentially comprises a central post 5 extending from the substrate 2 along the axis of rotation O and a free-standing oscillating structure, indicated globally by reference numeral 6, connected to the central post 5.

The free-standing oscillating structure 6 includes an outer ring 60 coaxial with the axis of rotation O, and a plurality of spring elements 62 disposed symmetrically around the central post 5 and connecting the outer ring 60 to the central post 5. The spring elements 62 are essentially formed as curved rod-shaped spring elements. It will be appreciated that the central post 5 constitutes the only mechanical connection of the ring resonator 4 with the substrate 2 and that oscillation of the resonator takes place in a plane substantially parallel to the surface of the substrate 2.

The ring resonator 4 further comprises pairs of diametrically opposed electrode structures surrounding the outer ring 60, indicated by reference numeral 9 in FIG. 1. According to this first embodiment, comb-shaped members 8 are provided on the outer ring 60 of the free-standing oscillating structure 6. These comb-shaped members 8 form a part of the electrode structures of the ring and each include a base member 80 extending radially from the outer ring 60 and first and second lateral members, indicated respectively by reference numerals 82 and 84, that extend substantially perpendicularly from both sides of the base member 80.

The electrode structures 9 comprise first and second comb-shaped electrode structures 91 and 93 surrounding the outer ring 60 in such a way that they mesh with the comb-shaped members 8 of the free-standing oscillating structures. More particularly, according to this embodiment, the first comb-shaped electrode structure 91 includes first electrodes 92 and meshes with comb-shaped member 8 so that the first electrodes 92 are adjacent to the first lateral members 82. Similarly, the second comb-shaped electrode structure 93 (disposed opposite the first comb-shaped electrode structure 91) includes second electrodes 94 and meshes with comb-shaped member 8 so that the second electrodes 94 are adjacent to the second lateral members 84. As shown in FIG. 1, the lateral members 82, 84 and the electrodes 92, 94 of the first and second electrode structures 91, 93 are preferably designed so as to have the shape of an arc of a circle concentric with the outer ring 60.

In this embodiment, the first comb-shaped electrode structures 91 serve to electrostatically drive the ring resonator 4 into oscillation, and the second comb-shaped electrode structure 93, which are disposed on the other side of the base members 80, serve to capacitively sense the oscillation of the resonator. The first electrode structures 91 surrounding the resonator 4 are connected together via a first conductor 11 formed on the substrate 2, and, similarly, the second electrode structures 93 are connected together via a second conductor 12 formed on the substrate 2. These conductors 11, 12 as well as a third conductor 13 providing an electrical contact to the ring via the central post 5 are connected to appropriate terminals of the electronic circuit 3.

FIG. 4 shows a cross-sectional view of the ring resonator 4 taken along line A–A' as illustrated in FIG. 1. Thickness and other dimensions are not to scale. There is shown the substrate 2, the central post 5 along the axis of rotation O of the ring resonator, the free-standing oscillating structure 6 including the outer ring 60 and the spring elements 62, the lateral members 82 of the comb-shaped members 8, the electrodes 92 of the first comb-shaped electrode structures 91, and the first and second connectors 11, 12 that respectively connect the electrode structures 91 and 93 surrounding the outer ring 60. FIG. 4 further shows a first insulating layer 20, such as a silicon oxide layer, formed above the surface of substrate 2, beneath the ring resonator 4 and onto which are formed the first and second conductors 11, 12. A second insulating layer 21, such as another oxide layer or silicon nitride layer, is formed above the first layer 20 below the ring resonator.

The resonating ring structure is preferably manufactured by means of silicon surface micro-machining techniques which are familiar to those skilled in the art and will therefore not be described here. One such technique makes use of a poly-silicon layer deposited on top of a so-called "sacrificial layer" in order to form the free-standing structures of the resonator. Another technique uses a buried oxide layer, such as e.g. in a silicon on insulator (SOI) wafer, as the sacrificial layer and results in a free-standing structure made of mono-crystalline silicon. Other material and processing techniques, however, may also be used to realise the micromechanical ring resonator according to the present invention.

One of the major objectives for an application as a time base or frequency standard is a high quality factor Q of the resonator. A high quality factor Q results in a stable oscillation with low phase noise and low power consumption as is required for horological applications. The quality factor Q of the micromechanical ring resonator is very high due to a number of advantageous design features that will be explained below. As already mentioned hereinabove, quality factors as high as $2 \times 10^5$ have been measured on these structures. For comparison, tuning-fork quartz resonators usually exhibit values between $5 \times 10^4$ and $1 \times 10^5$ after laser trimming of the fork tines.

The shape of the spring elements 62 connecting the outer ring 60 to the central post 5 is optimised so as to obtain a high quality factor Q. In contrast to the conditions present when using straight spring elements, the tensions along the bending line are, in the present case, homogeneously distributed along the spring element. The curved shape is such that energy losses per oscillation period are kept minimal.

Figure 2:
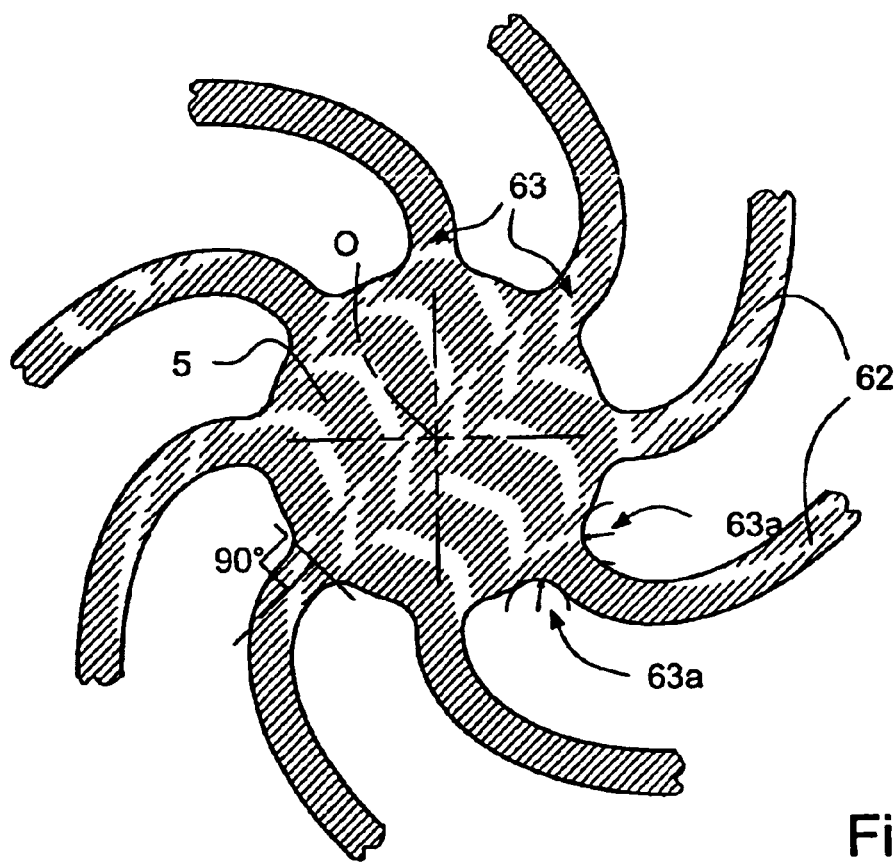
FIG. 2 is a detailed view of the central post of the micromechanical ring resonator and its junctions with the spring elements.
Figure 3:
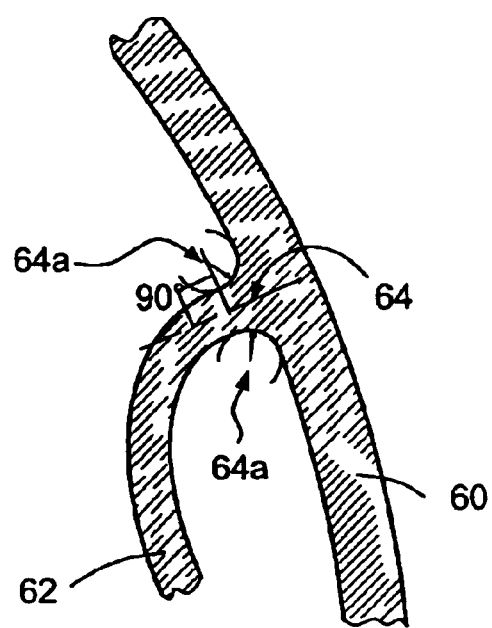
FIG. 3 is a detailed view of a portion of the outer ring with its junctions with the spring elements.

In addition, junctions 63 of the spring elements 62 with the central post 5 are substantially perpendicular, as shown in FIG. 2. Preferably, round shapes or fillets 63a are provided at the junctions 63. These fillets 63a prevent notch tensions during oscillation, thereby favouring an elevated quality factor Q, as substantially no energy is dissipated in the central post 5 during oscillation. Furthermore, the central post 5 remains substantially free of tension, which again favours a high quality factor Q. FIG. 3 shows the junctions 64 of the spring elements 62 with outer ring 60. Here also, substantially perpendicular junctions 64 and fillets 64a are preferred designs.

Using a plurality of spring elements 62 rather than the minimum of three required for a well-defined suspension increases the quality factor Q. Due to the fact that minor geometrical variations (e.g. as a result of spatial fluctuations in processing) as well as material inhomogeneities are averaged over the plurality of spring elements, the quality factor Q increases with the number of spring elements. The upper limit is given by geometrical restrictions due to the design rules of the micro-structuring process. The number of spring elements is therefore comprised between four and fifty, and preferably is of the order of twenty.

Another element favouring a high quality factor Q of the ring resonator is the perfect rotationally symmetrical structure, where the centre of gravity of the entire structure remains motionless. Non-linear effects, present in most other resonator designs, are thereby removed to a large extent.

Figure 5:
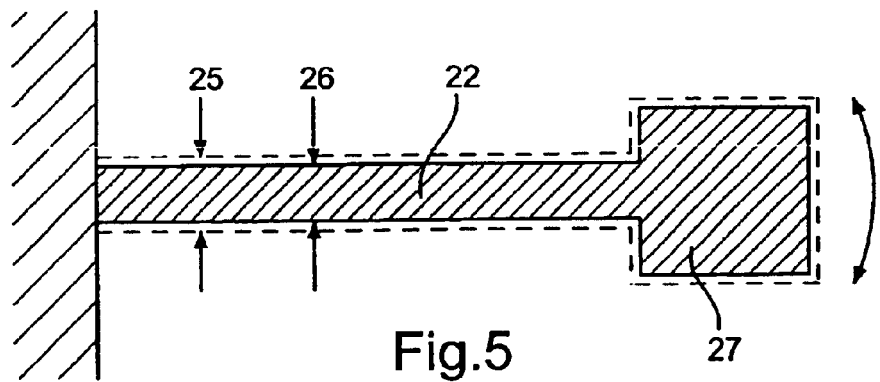
FIG. 5 shows an idealized straight spring element with a section of the outer ring.

The resonant frequency of the ring resonator can be adjusted over a wide range by changing the geometrical dimensions of the device. The ring resonator can be looked at as a plurality of spring elements connected to a segment of the outer ring. In a zero-order approximation, and in order to obtain a close algebraic expression for the resonant frequency, one can study the case of a straight spring element 22 with a segment 27 of the outer ring 60, as shown in FIG. 5. The resonant frequency $f_r$ of this structure reads:

$$f_r \approx \frac{1}{2\pi} \sqrt{\frac{3 \cdot E \cdot J}{l^3 (m_r + 0.24 \cdot m_s)}}$$

where $J = d \cdot w^3 / 12$ is the surface moment of inertia of the structure, E is the elasticity module, d, w and l are the thickness, width and length of the straight spring element 22, respectively, and $m_r$, $m_s$ are the masses of the ring segment 27 and spring element 22, respectively. It can be easily seen from the above formula, that the resonance frequency can be influenced by varying the width and/or length of the spring elements or by varying the mass of the outer ring (including the mass of the comb-shaped members 8), again via its geometrical dimensions. Scaling of the entire structure further widens the accessible frequency range.

It is important for mass production of such ring resonators to keep the resonant frequency from one chip to the other within small tolerances. Tolerances in the resonant frequency due to slight variations in process parameters can be greatly reduced by carefully dimensioning the ring and springs. This can again be shown using the example of FIG. 5. The resonant frequency will be lower than the projected frequency if the width of the spring elements 22, indicated by reference numeral 26, is smaller after processing, e.g. due to an over-etch, than a desired width 25. However, if one considers that at the same time the mass of the ring 60 (as well as the mass of the base members 80 and lateral members 82, 84) is lowered due to the same over-etch, the decrease of the resonant frequency will be compensated for by the reduction of the masses. Openings in the ring and the bars (not shown in the Figures), which may be necessary for processing the structure, favour this effect.

The surface area required by the micromechanical ring resonator is very small with respect to the resonant frequency obtained. For instance, a ring resonator designed for a rather low frequency of 32 kHz requires a surface of well below 1 mm$^2$. Conventional structures require relatively large structures in order to obtain such a low frequency. For a given geometrical layout, the dimensions and frequency are inversely related, i.e. the larger the geometrical dimensions, the lower the frequency. For comparison, EP 0 795 953 describes a silicon resonator requiring a surface of about 1.9 mm$^2$ for a higher frequency of 1 MHz. It is obvious that the substrate surface area required by the resonator is directly related to the price of the integrated time base.

The resonant frequency of the ring resonator is, within the temperature range of 0 to 60° C., in good approximation, a linear function of temperature. At a resonant frequency of 45 kHz, it has been observed that the thermal coefficient of the resonant frequency is of the order of −25 ppm/° C. It is thus desirable to incorporate, in the same substrate 2, a temperature measuring circuit having an output signal which may be used to compensate for the frequency variation by adequately adjusting the frequency of the signal produced by the time base.

To this effect, the time base may advantageously comprise an integrated temperature measuring circuit (not shown). An example of such a temperature measuring circuit is described in the article "Smart Temperature Sensor in CMOS Technology" by P. Krumenacher and H. Oguey, in "Sensors and Actuators", A21–A23 (1990), pages 636 to 638. Here, temperature compensation is achieved by acting on the division ratio of the division chain, for instance using an inhibition technique well known to those skilled in the art.

Alternatively, two ring resonators with different resonant frequencies may be integrated onto the same chip, such arrangement allowing the chip temperature to be precisely determined by measuring the frequency difference of the two resonators (both ring resonators have the same temperature coefficient since they are made from the same material).

The advantage of using integrated time bases as described hereinabove is twofold: Firstly, the temperature dependency of the ring resonator is linear which facilitates the electronic signal treatment necessary to compensate for the temperature. Secondly and more importantly, the small size and monolithic integration of the ring resonator allows a second resonator to be provided with only a slight increase in chip size and without further external connections.

Figure 11A:
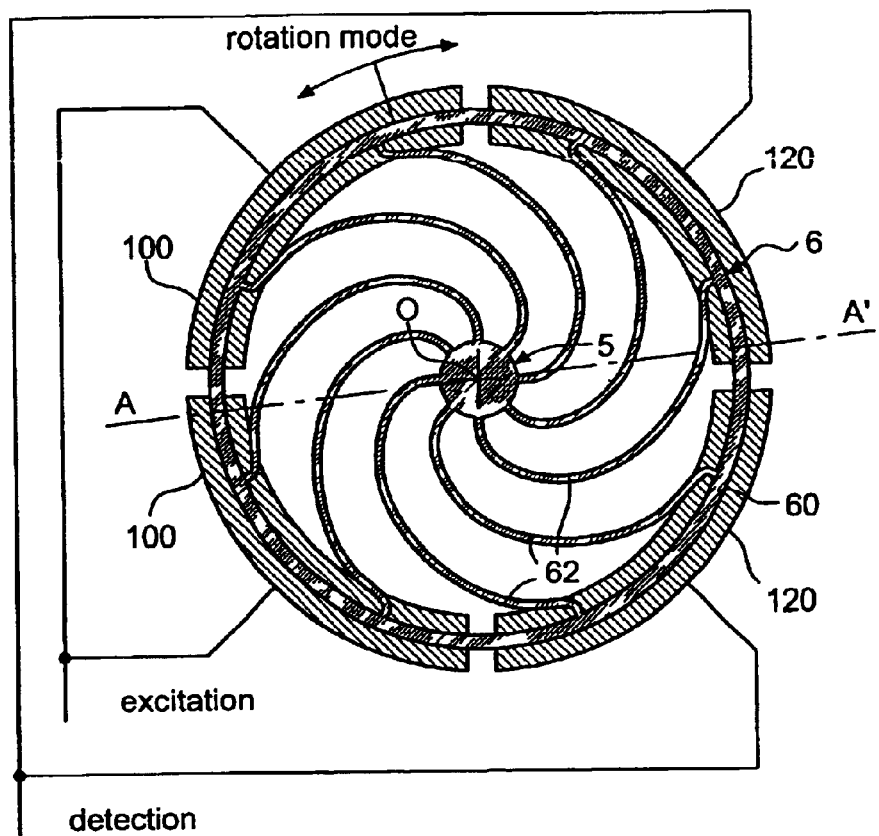
FIGS. 11a and 11b are respectively top and cross-sectional views illustrating a second mode of oscillation where the resonator performs a tilting oscillation.
Figure 11B:
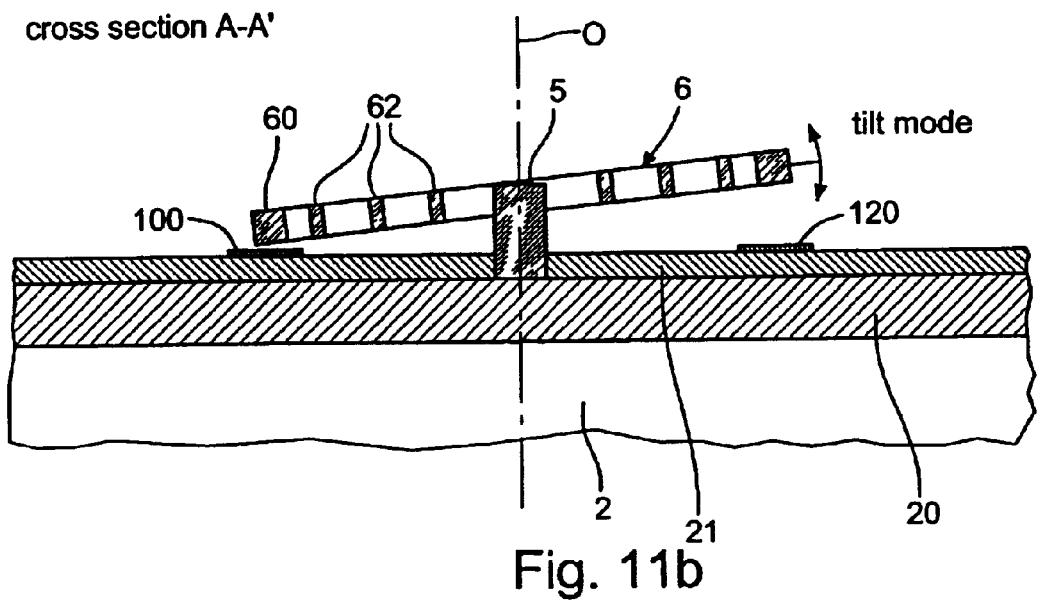

Alternatively, according to the invention, it is possible to use a single ring resonator which operates simultaneously with two oscillation modes. A first of these modes is the above described rotational mode. A second oscillation mode may be a tilting oscillation mode, wherein the free-standing structure 6 performs a tilting oscillation against the substrate plane. This tilting oscillation mode may be excited electrostatically and sensed capacitively by using further electrodes on the substrate under the ring area. The two modes are selected to have different frequencies so that temperature compensation may be achieved by measuring the frequency difference. A schematic illustration of the above mentioned tilt mode is shown in FIGS. 11a and 11b. As shown in these figures, two sets of electrodes 100 and 120 (in this case four) having substantially the shape of arcs of circles are disposed on the substrate under the ring 60 so that the first set of electrodes 100 drives the structure 6 into a tilting oscillation and the second set of electrodes 120 senses this tilting oscillation. The set of driving electrodes 100 and the set of sensing electrodes 120 are disposed on opposite sides of the structure 6 with respect to the central post 5 (respectively on the left and right sides in FIG. 11a).

Figure 12A:
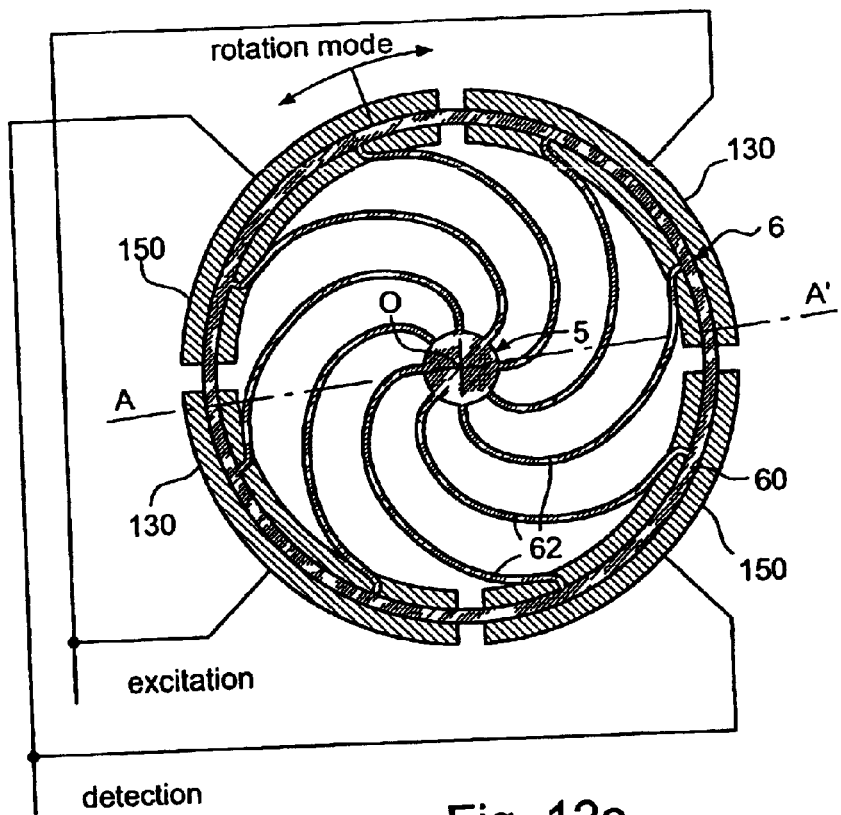
FIGS. 12a and 12b are respectively top and cross-sectional views illustrating another second mode of oscillation where the resonator performs a vertical oscillation perpendicular to the substrate plane.
Figure 12B:
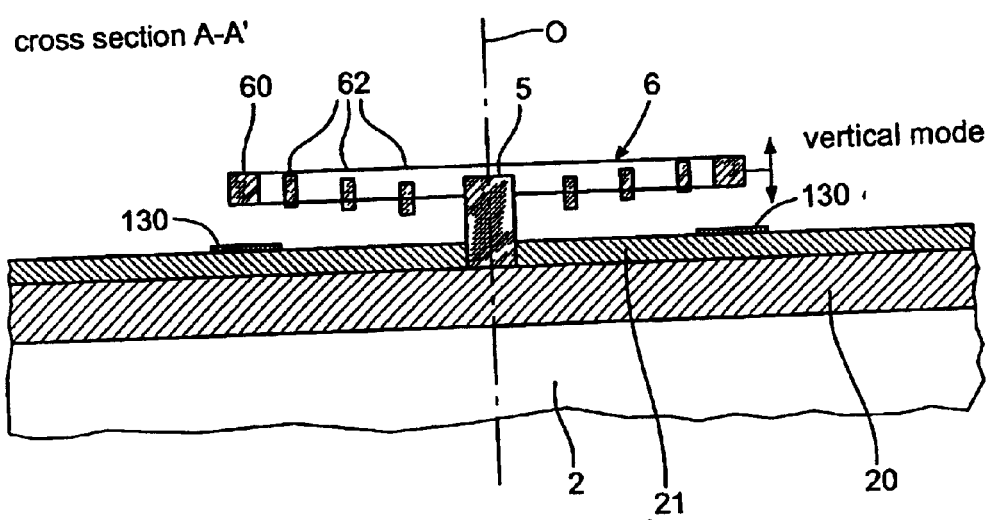

A second oscillation mode may be a vertical oscillation mode, wherein the free-standing structure 6 performs a vertical oscillation perpendicular to the substrate plane, i.e. the free-standing structure 6 oscillates in a direction parallel to the axis of rotation O. A schematic illustration of the above mentioned perpendicular mode is shown in FIGS. 12a and 12b. As shown in these figures, two sets of electrodes 130 and 150 are disposed on the substrate under the ring 60 so that the first set of electrodes 130 drives the structures 6 into an oscillation perpendicular to the substrate plane and the second set of electrodes 150 senses this oscillation. In contrast to the tilting mode, the set of driving and sensing electrodes 130, 150 are disposed symmetrically around the central post 5, i.e. the sets of electrodes each comprise diametrically opposed electrodes.

As already mentioned, the comb-shaped electrode structures 91 shown in the embodiment of FIG. 1 serve to electrostatically drive the ring resonator into oscillation and the opposite comb-shaped electrode structures 93 serve to capacitively sense this mechanical oscillation. An alternating voltage signal is applied to electrode structures 91 resulting in electrostatic forces on the ring and oscillation thereof, which, in turn, induces an alternating signal on the opposite set of electrode structures 93, when the resonator operates. It will be understood that electrode structures 91 and 93 are interchangeable.

Since there is a parabolic relationship between the voltage applied on the electrodes and the resulting force on the ring and, it is desirable to add a constant direct voltage to the alternating voltage so as to obtain a substantially linear force-voltage relationship. In the schematic representation of FIG. 1, there are shown three signal lines or conductors 11 to 13 that are respectively connected to electrode structures 91, electrode structures 93 and central post 5. These lines serve to drive the ring resonator into oscillation and to sense this oscillation via the respective electrode structures.

According to a first variant, conductor 13 may be used to apply the direct voltage component to the ring resonator via the central post 5, while the alternating voltage component is applied to electrode structures 91 via conductor 11, conductor 12 being used to sense the resulting signal. According to a second variant, the alternating driving voltage and the direct voltage component may be superposed on electrode structures 91 via conductor 11 while the ring resonator is tied to a fixed potential, such as e.g. ground, via conductor 13. Conductor 12 is used to sense the signal in this case. It will be appreciated that electrode structures 91 and 93 are interchangeable and that electrode structures 93 may alternatively be used for driving, electrode structures 91 being used for sensing.

Figure 6:
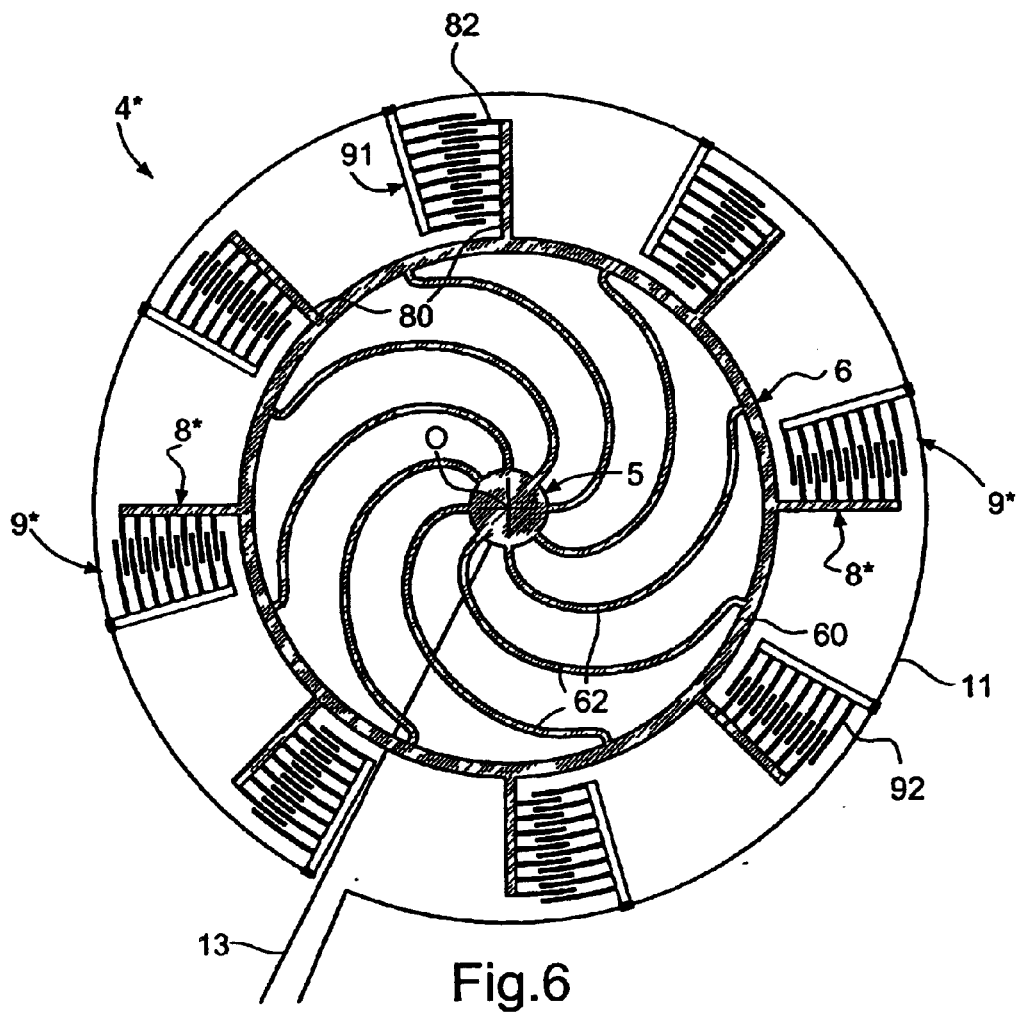
FIG. 6 shows a top view illustrating schematically a second embodiment of a time base.

Alternatively, sensing may be done by detecting a change in impedance at resonance. As represented in FIG. 6, such a solution requires only two conductors, 11 and 13, and an electrode structure 9* comprising a single set of comb-shaped electrode structures 91 connected to conductor 11 (the comb-shaped members 8* are modified accordingly and only comprise first lateral members 82). According to a first variant, the alternating driving voltage is applied, via conductor 11, to the single set of electrode structures 91, and the direct voltage component is applied to the ring via conductor 13. According to another variant, the sum of alternating and direct driving voltages can be applied to electrode structures 91 via conductor 11, the ring being in this case tied via conductor 13 to a fixed potential such as e.g. ground.

The two-conductor option provides two advantages, namely (i) a reduction in the diameter of the entire structure since a second conductor and a second set of electrode structures surrounding the ring is no longer required, and (ii) the possibility of providing a larger number of comb-shaped electrode structures 91 along the periphery of the outer ring 60, resulting in an enhanced signal.

The different modes of operation of the ring resonator are summarized in the following table. It will be appreciated that, in any of the above-mentioned variants, the signals applied to the driving electrodes and the ring, namely the alternating driving voltage and the direct voltage component, are perfectly interchangeable.

|  | Electrodes 91 | Ring | Electrodes 93 | Remarks |
| --- | --- | --- | --- | --- |
| 3 Conductors | AC-driving | DC-bias | Sensing | Electrodes 91 and 93 are interchangeable |
|  | AC-driving + DC bias | Fixed potential, e.g. ground | Sensing |  |
|  | DC-bias | AC-driving | Sensing |  |
|  | Fixed potential, e.g. ground | AC-driving + DC-bias | Sensing |  |
| 2 Conductors | AC-driving | DC-bias | — | Sensing is done by detecting a change in impedance at resonance |
|  | AC-driving + DC bias | Fixed potential, e.g. ground | — |  |
|  | DC-bias | AC-driving | — |  |
|  | Fixed potential, e.g. ground | AC-driving + DC-bias | — |  |

The fact that the lateral members 82, 84 and the electrodes 92, 94 are of curved shape and concentric with outer ring 60 reduces non-linearities in the electro-mechanical coupling, resulting in a high quality factor Q on the one hand and a resonant frequency of the ring resonator which is essentially independent of the amplitude of alternating and direct driving voltages on the other hand. Furthermore, the micromechanical ring resonator can be driven with voltages as low as 1.5 V, which is a major advantage for portable electronic applications.

In addition, due to electrostatic driving and capacitive sensing, and due to the high quality factor Q determined by the design, the power consumption of the ring resonator is ten to hundred times lower than that of a quartz, which is of particular interest for portable electronics applications.

Figure 7A:
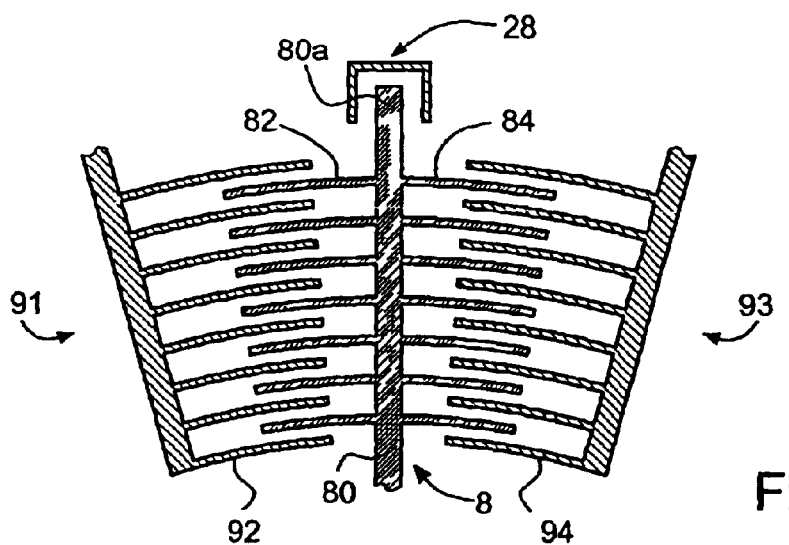
FIGS. 7a to 7c show detailed top views of three different designs intended to prevent the ring resonator from sticking on the electrode structures.
Figure 7B:
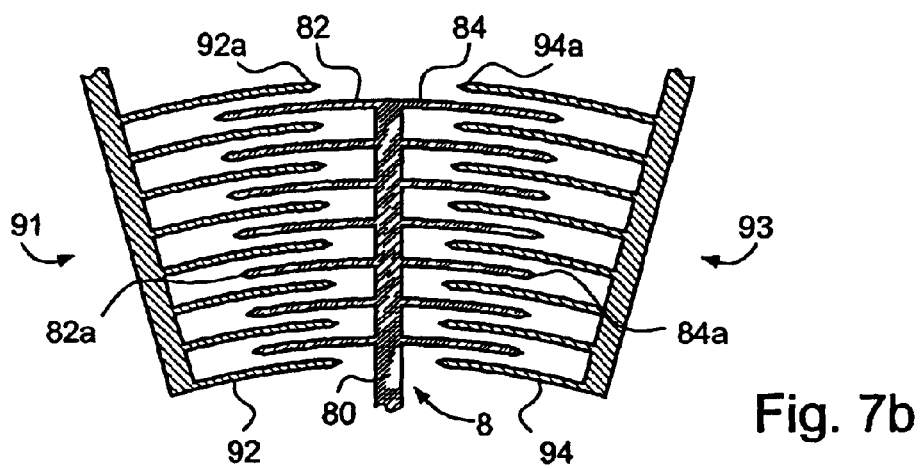
Figure 7C:
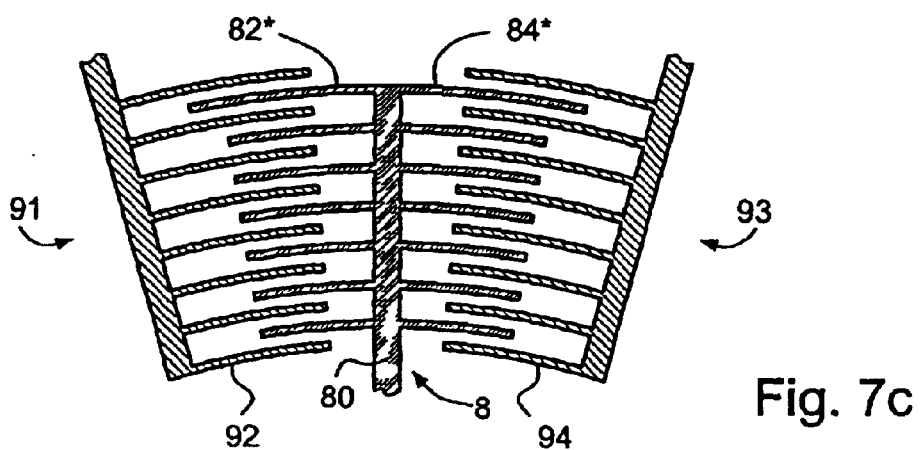

FIGS. 7a to 7c show three different advantageous design features intended to prevent the ring resonator from sticking in case of a shock. According to a first variant shown in FIG. 7a, stop structures 28 disposed on the substrate 2 are provided at outer ends 80a of the base members 80. These stop structures 28 are designed so as to limit the angular movement of the ring structure 6 and therefore prevent the free-standing oscillating structure 6 from sticking on the electrode structures 9 when excessive angular movements take place due, for instance, to mechanical shocks.

Alternatively, as shown in FIG. 7b, extremities 82a, 84a of the lateral members 82, 84 and/or extremities 92a, 94a of the electrodes 92, 94 may be designed so as to exhibit a pointed shape or at least a suitably small surface area so as to prevent sticking.

Finally, as shown in the variant of FIG. 7c, one 82*, 84* of the lateral members 82, 84 can be made longer than the others, thereby reducing the adhesion forces when the comb-shaped members 8 and the comb-shaped electrode structures 91, 93 get into mechanical contact with each other. Obviously, the same effect may be obtained when one of electrodes 92 and 94 is longer than the others.

Figure 8:
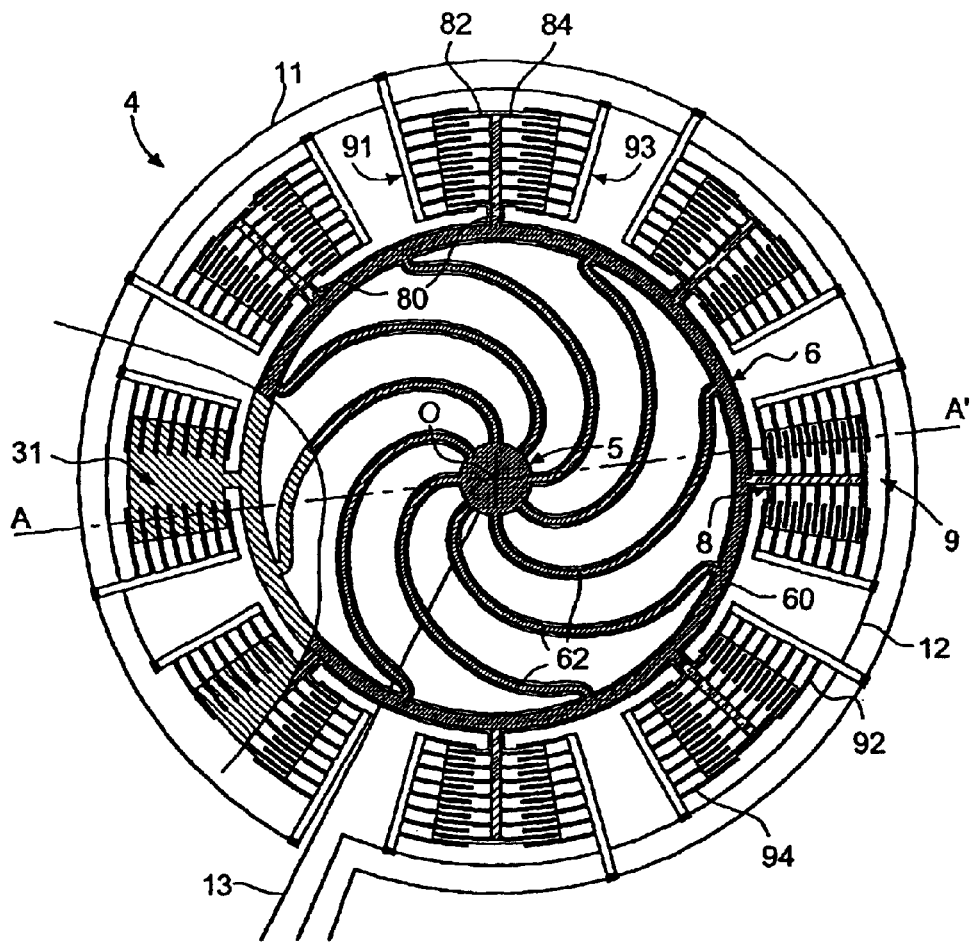
FIG. 8 shows a top view illustrating an improvement of the first embodiment shown in FIG. 1.
Figure 9:
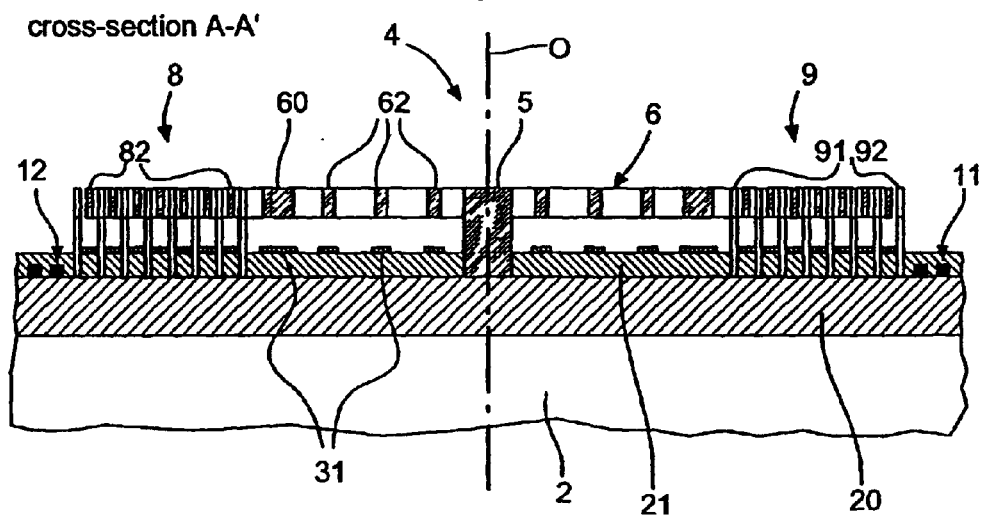
FIG. 9 is a cross-sectional view of the embodiment of FIG. 8 taken along line A–A'.

FIGS. 8 and 9 show an improvement of the micromechanical ring resonator 4 which is illustrated in FIG. 1. FIG. 9 shows a cross-sectional view of FIG. 8 taken along line A–A'. A conductive pattern 31 is provided on (or below) the surface of the substrate 2 under at least part of the free-standing oscillating structure 6, i.e. spring elements 62, outer ring 60, as well as comb-shaped members 8, the shape of this conductive pattern 31 being essentially a projection of the free-standing oscillating structure 6 on the surface of the substrate 2. Connecting this conductive pattern 31 to the same potential as the free-standing oscillating structure 6 suppresses forces perpendicular to the substrate 2 between the ring resonator 4 and the surface of the substrate 2 leading to a resonant frequency which is independent of the direct voltage component.

Figure 10A:
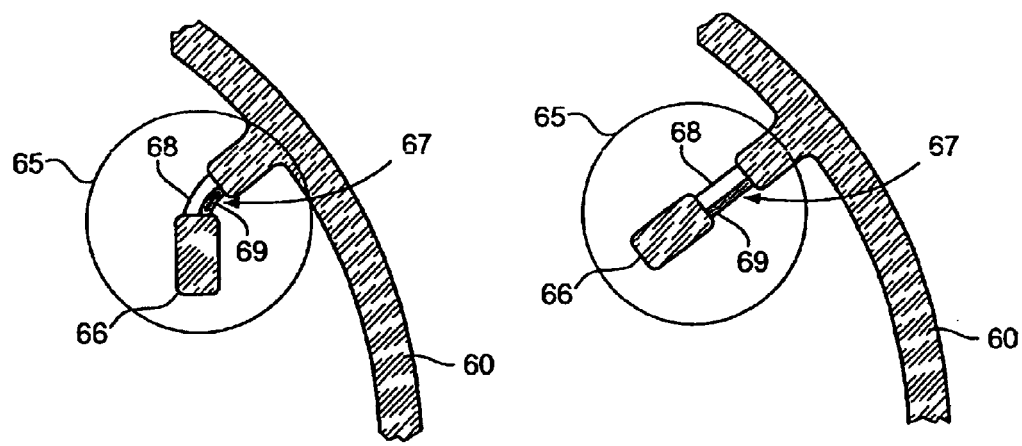
FIGS. 10a and 10b are two top views illustrating two variants of a mechanism for altering the mass moment of inertia of the ring resonator as a function of temperature, in order to substantially compensate for the effect of temperature on the resonant frequency of the ring resonator.
Figure 10B:
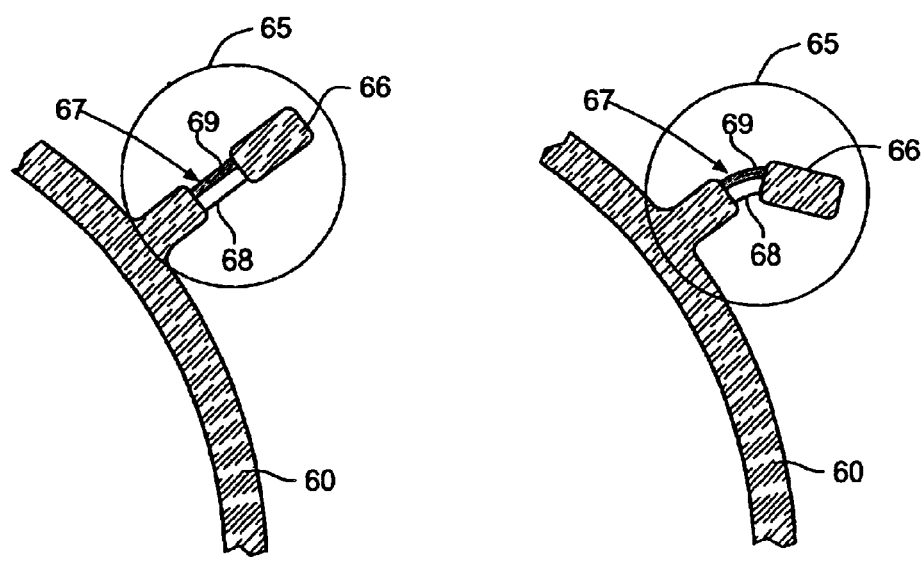

FIGS. 10a and 10b show further improvements of the micromechanical ring resonator 4 which allow the temperature coefficient of the resonant frequency to be reduced to a value close to zero. Two main factors determine the temperature characteristics of the ring resonator. Firstly, Young's modulus E of the material used to realize the vibrating structure decreases with increasing temperature resulting in a reduced stiffness of the spring elements 62 and therefore a lower resonant frequency. Secondly, due to thermal expansion, the diameter of the ring will increase with increasing temperature resulting in an increased mass moment of inertia of the structure, which, in turn, also reduces the resonant frequency.

Different thermal expansion coefficients of different materials can be used to introduce a compensation mechanism 65, as sketched in FIG. 10a or 10b. As shown in FIGS. 10a and 10b, a plurality of thermally compensating members 65 (only one is shown in the Figures) are attached to the outer ring 60. These thermally compensating members 65 are designed to alter the mass moment of inertia of the free-standing oscillating structure 6 as a function of temperature so as to substantially compensate for the effect of temperature on the resonant frequency of the resonator 4. To this effect, the members 65 include a weight member 66 connected to the outer ring 60 by means of a connecting member 67 comprising first and second layers 68, 69 made respectively of first and second materials having different thermal coefficients. The materials are chosen so that the thermal expansion coefficient $\alpha_{th1}$ of the first layer 68 is smaller than the thermal expansion coefficient $\alpha_{th2}$ of the second layer 69. In a preferred embodiment, the first material is silicon and the second material is a metal, preferably aluminium.

The design of the mechanism 65 according to FIG. 10a is such that, with increasing temperature, the connecting member 67 straightens due to the different thermal expansion of the first and second layers 68, 69. As a consequence, the weight members 66 move towards the centre of the ring, i.e. closer to the axis of rotation O of the oscillating structure 6, thereby reducing the mass moment of inertia of the ring resonator, resulting in an increase of the resonant frequency which substantially counteracts the effect of the Young's modulus and the thermal expansion of the ring on the resonant frequency. Such thermal compensation mechanisms can alternatively be attached to the outer side of the ring 60, as shown in FIG. 10b, or to some other part of the free-standing oscillating structure 6 so as to alter its mass moment of inertia as a function of temperature. The layout and fabrication of the members 65 have to be realized so that the weight members 66 move towards the axis of rotation O of the ring resonator when temperature increases.

Having described the invention with regard to certain specific embodiments, it is to be understood that these embodiments are not meant as limitations of the invention. Indeed, various modifications and/or adaptations may become apparent to those skilled in the art without departing from the scope of the annexed claims.

What is claimed is:

1. A time base comprising a resonator and an integrated electronic circuit for driving said resonator into oscillation and for producing, in response to said oscillation, a signal having a determined frequency, said resonator being an integrated micromechanical ring resonator supported above a substrate and adapted to oscillate, according to a first oscillation mode, around an axis of rotation substantially perpendicular to said substrate, said ring resonator comprising:
   a central post extending from said substrate along said axis of rotation;
   a free-standing oscillating structure connected to said central post and including an outer ring coaxial with said axis of rotation and connected to said central post by means of a plurality of spring elements; and
   electrodes disposed around said outer ring and connected to said integrated electronic circuit,
   wherein said electrodes are positioned under said free-standing oscillating structure in such a way as to drive and sense a second oscillation mode in a plane substantially perpendicular to said substrate and having a resonant frequency which is different from the resonant frequency of said first oscillation mode, a frequency difference between the resonant frequencies of both oscillation modes being used for compensating for the effect of temperature on the frequency of the signal produced by said time base.

2. The time base according to claim 1, wherein said second oscillation mode is a tilting oscillation mode.

3. The time base according to claim 2, wherein said electrodes disposed under the free-standing oscillating structure for driving and sensing the ring resonator tilting oscillation comprise at least one driving electrode disposed on a first side of the free-standing oscillating structure and at least one sensing electrode disposed on an opposite side of the free-standing oscillating structure.

4. The time base according to claim 1, wherein said second oscillation mode is a vertical oscillation mode parallel to said axis of rotation.

5. The time base according to claim 4, wherein said electrodes disposed under the free-standing oscillating structure for driving and sensing the ring resonator vertical oscillation comprise one pair of diametrically opposed driving electrodes and one pair of diametrically opposed sensing electrodes.

6. The time base according to claim 1, wherein said electrodes comprise a first set of electrodes, disposed around said outer ring, and a second set of electrodes positioned under said free-standing oscillating structure.

7. In a time base comprising a resonator, a method for driving said resonator into oscillation, said resonator being an integrated micromechanical ring resonator supported above a substrate and comprising:
   a central post extending from said substrate along an axis of rotation substantially perpendicular to said substrate;
   a free-standing oscillating structure connected to said central post and including an outer ring coaxial with said axis of rotation and connected to said central post by means of a plurality of spring elements; and
   electrodes disposed around said outer ring,
   said method comprising a step of driving said ring resonator into oscillation, according to a first oscillation mode, around said axis of rotation,
   wherein said method further comprises the steps of:
   providing said electrodes under said free-standing oscillating structure so as to drive and sense a second oscillation mode of said ring resonator in a plane substantially perpendicular to said substrate and having a resonant frequency which is different from the resonant frequency of said first oscillation mode, and
   measuring a frequency difference between the resonant frequencies of the first and second oscillation modes for compensating for the effect of temperature on the frequency of a signal produced by the time base.

8. The method according to claim 7, wherein said second oscillation mode is a tilting oscillation mode.

9. Method according to claim 7, wherein said second oscillation mode is a vertical oscillation mode parallel to said axis of rotation.

* * * * *